(12) United States Patent
Voglewede et al.

(10) Patent No.: US 7,227,914 B2
(45) Date of Patent: Jun. 5, 2007

(54) AUTOMATIC GAIN CONTROL FOR DIGITAL SIGNALS

(75) Inventors: Paul Edward Voglewede, Churchville, NY (US); Clifford Hessel, Rochester, NY (US); James Anthony Norris, Fairport, NY (US)

(73) Assignee: Harris Corporation, Melbourne, FL (US)

( * ) Notice: Subject to any disclaimer, the term of this patent is extended or adjusted under 35 U.S.C. 154(b) by 686 days.

(21) Appl. No.: 10/012,530

(22) Filed: Dec. 12, 2001

(65) Prior Publication Data

US 2003/0108129 A1    Jun. 12, 2003

(51) Int. Cl.
*H04L 27/08*    (2006.01)
*H04B 1/06*    (2006.01)

(52) U.S. Cl. .................... 375/345; 455/234.1
(58) Field of Classification Search ........... 375/345, 375/316; 330/254; 455/234.1, 232.1
See application file for complete search history.

(56) References Cited

U.S. PATENT DOCUMENTS

| | | | |
|---|---|---|---|
| 3,978,407 A * | 8/1976 | Forney et al. | 375/231 |
| 4,309,764 A * | 1/1982 | Acampora | 370/318 |
| 4,870,370 A * | 9/1989 | Hedberg et al. | 330/133 |
| 5,422,601 A * | 6/1995 | Kovacs et al. | 330/279 |
| 5,577,056 A * | 11/1996 | Malik et al. | 714/812 |
| 5,917,865 A * | 6/1999 | Kopmeiners et al. | 375/345 |
| 5,950,112 A * | 9/1999 | Hori et al. | 725/148 |
| 6,212,244 B1 * | 4/2001 | Davidovici et al. | 375/345 |
| 6,282,249 B1 * | 8/2001 | Tomesen et al. | 375/327 |
| 6,363,127 B1 * | 3/2002 | Heinonen et al. | 375/345 |
| 6,567,118 B1 * | 5/2003 | Al-Araji et al. | 348/180 |
| 6,594,098 B1 * | 7/2003 | Sutardja | 360/65 |
| 6,654,594 B1 * | 11/2003 | Hughes et al. | 455/245.1 |
| 6,859,504 B1 * | 2/2005 | Kowalski | 375/345 |

OTHER PUBLICATIONS

Lovrich, Al, & Chirayil, Raj, "An All-Digital Automatic Gain Control", All, Texas Instruments Application Report; SPRA081, 1997.

* cited by examiner

*Primary Examiner*—Betsy L. Deppe
(74) *Attorney, Agent, or Firm*—Duane Morris LLP

(57) ABSTRACT

A system and method of automatic gain control (AGC) processing of digital signals using Block AGC to acquire the signal and sample-by-sample AGC to track the signal.

29 Claims, 1 Drawing Sheet

AUTOMATIC GAIN CONTROL FOR DIGITAL SIGNALS

BACKGROUND OF THE INVENTION

The present system and method is generally applicable to the processing of digital signals, and specifically for a system and method of automatic gain control processing to detect and demodulate a received signal.

In a typical digital communication system, a digital signal may be comprised of a preamble followed by the data payload. The preamble contains a series of bits or symbols which provides information relating to the waveform type, the data rate, the phase error, the timing error and the frequency offset necessary to demodulate the received signal. It is common to use a process of automatic gain control (AGC) to process the received digital signal bit by bit, or sample by sample, in order to detect the presence of the waveform and extract the information needed to demodulate the data received in the signal where a sample may include a symbol or plural bits.

The sample-by-sample AGC process normally starts at a zero state and ramps up when a signal is received to bring the received signal to an optimum level for the receiver. The "settling" time of an AGC is the time required by the AGC to bring the received signal to an optimum level within the dynamic range of the receiver. During the settling time, the receiver is generally unable to perform other functions, such as training, symbol detection, etc. This means that the settling time tends to increase the "overhead" of the receiver.

Because the time of arrival of a received signal is generally not known, it is extremely important to minimize the settling time of the AGC so that the received signal can be brought to an optimum level as quickly as possible. The slower the AGC processing, the more distortion will be introduced into the signal preamble due to the transient effect on the leading edge of the received signal. This preamble distortion may degrade the ability of the processor to detect the preamble and may result in less than optimal modem performance. One known method of addressing the problem of settling time and the resultant preamble distortion is to increase the length of the preamble sufficiently to account for the settling time and to allow sufficient processing of the preamble. Thus, the conventional sample-by-sample AGC is not suitable for short duration preamble waveforms.

The same sample-by-sample AGC processor is typically used for both searching for the signal (preamble detection) and for tracking the signal (demodulation) once the signal is detected. A sample-by-sample AGC processor requires a sufficient number of bits or samples in order to detect and begin processing the preamble and thus tend to be slow.

The present disclosure increases the processing of digital signals by implementing two stage automatic gain control processing. In the searching stage, a block AGC processor is utilized to detect the signal, and in the tracking stage, a sample-by-sample AGC processor, using parameters passed from the block AGC processor as an initial condition, demodulates the signal.

Accordingly, it is an object of the present invention to provide a novel method and system for detecting and demodulating digital signals.

It is another object of the present invention to provide a novel system and method of decreasing the time required to detect a signal using automatic gain control.

It is a yet another object of the present invention to provide a novel system and method or reducing the distortion introduced through automatic gain control processing.

It is still another object of the present invention to provide a novel system and method to reduce the transient effect of automatic gain control processing during preamble detection which permits the use of a shorter preamble.

These and many other objects and advantages of the present invention will be readily apparent to one skilled in the art to which it pertains from a perusal of the claims, the appended drawings, and the following detailed description of the preferred embodiments.

DETAILED DESCRIPTION OF THE DRAWINGS

Figure 1:
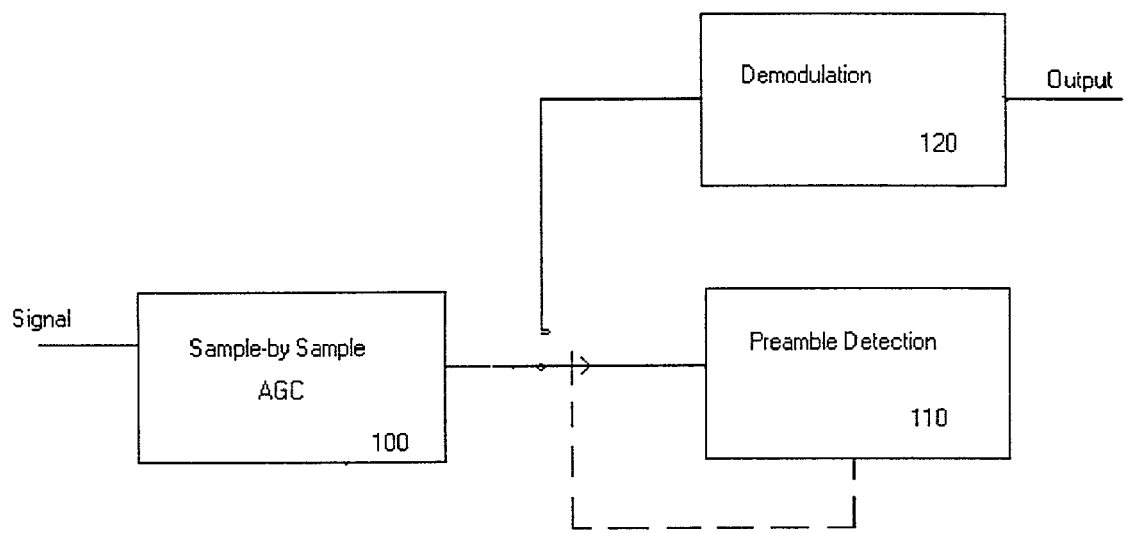
FIG. 1 is a block diagram of the processing steps of a conventional communication system using sample-by-sample automatic gain control processing for both acquisition and tracking a digital signal.

FIG. 1 represents a block diagram of a conventional digital signal processing of a communications receiver utilizing sample-by-sample automatic gain control. A digital signal is received by the sample-by-sample AGC processor 100 bit-by-bit or symbol-by-symbol. The preamble detection processing 110 determines the type of waveform detected, the data rate, the phase error and timing error and the frequency offset. This information is then utilized to demodulate the signal 120.

Figure 2:
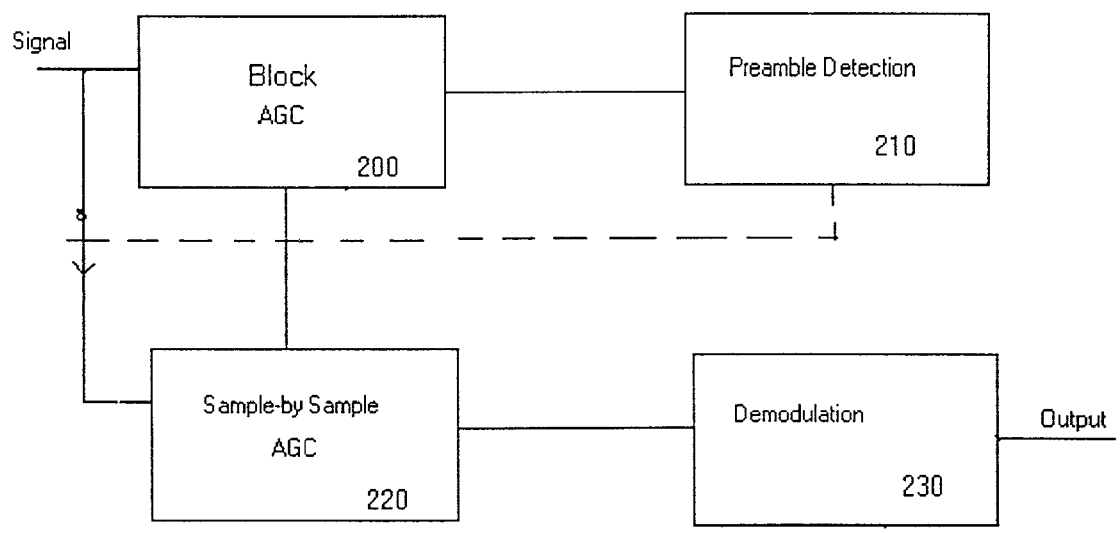
FIG. 2 is a block diagram of the processing steps of one embodiment of the present communication system using block automatic gain control for acquisition and sample-by-sample automatic gain control for tracking.

FIG. 2 represents a block diagram of an embodiment a digital signal processing circuit of a communication receiver of the present disclosure. The received signal undergoes block AGC processing 200 during the searching mode. The block AGC normalizes the block of symbols and passes the normalized block for preamble detection 210 in order to determine timing, phase and frequency offsets and baud rate for the received signal. Once the signal is acquired, the sample-by-sample AGC processing 220 utilizes the traditional sample-by-sample gain control with the initial conditions determined by the block gain control 200 used in the detection normalization process. During the tracking mode, sample-by-sample AGC 220 will control the gain during the demodulation process 230.

In operation, block AGC 200 uses Fast Fourier Transform (FFT) for determining the initial timing, phase and frequency offsets and baud rate. During the FFT block processing for signal search mode, a block AGC method will normalize the received symbols in that block of symbols. Because the block AGC does not begin processing until the entire block of symbols has been received, settling time is of no concern and thus, there will not be any added distortion due to the digital AGC slew rate common in conventional sample-by-sample AGC processing. Therefore, the present system and method is ideal for satellite communication systems and other systems utilizing short duration preamble waveforms.

In one embodiment of applicant's disclosure, root mean square (RMS) estimation is used on each FFT window. This result is then used to normalize each symbol before the Fourier transform is performed. Each FFT window is analyzed in one half blocks to determine the presence of the amplitude of the change caused by the start of the received signal. The normalization factor is then compensated by 3 dB to reduce the effect of the transient amplitude on the RMS calculation. Thus, the block automatic gain control circuit normalizes a block of symbols as a function of the root mean square average value of a predetermined attribute of each of the received symbols such as amplitude or voltage or energy.

In another embodiment of the applicant's disclosure, the block AGC normalizes a block of received symbols as a function of the average detection value of a predetermined attribute of the received symbols such as amplitude or voltage or energy.

In yet another embodiment of the applicant's disclosure, the block AGC normalizes a block of received symbols as a function of the peak detection value of a predetermined attribute of the received symbols such as amplitude or voltage or energy.

Once the search mode determines that a signal is present, the scaling from the block AGC 200 is forwarded to the bit AGC 220 for tracking. In one embodiment, the tracking AGC is a simple energy feedback loop.

When an end of a message is detected or if the signal is lost, the tracking AGC is halted and gain control reverts back to the block AGC in the searching mode.

While preferred embodiments of the present system and method have been described, it is to be understood that the embodiments described are illustrative only and the scope of the invention is to be defined solely by the appended claims when accorded a full range of equivalence, many variations and modifications naturally occurring to those skilled in the art from a perusal thereof.

What is claimed is:

1. A receiver in a communication system for receiving at an unknown time of arrival a waveform including data symbols, comprising:
 a first automatic gain control circuit for detecting and acquiring said waveform; and,
 a second automatic gain control circuit for tracking said waveform,
 wherein said first automatic gain control circuit and said second automatic gain control circuit operate sequentially and non-concurrently.

2. The receiver of claim 1 wherein said waveform is a short duration preamble waveform.

3. The receiver of claim 2 wherein said first automatic gain control circuit is a block automatic gain control circuit.

4. The receiver of claim 3 wherein said second automatic gain control circuit is a sample-by-sample automatic gain control circuit.

5. The receiver of claim 3 wherein said receiver partitions the data symbols of said waveform into a block of a predetermined number of symbols and wherein said block automatic gain control circuit normalizes said block of received symbols as a function of the average value of a predetermined attribute of each of the received symbols in said block of received symbols.

6. The receiver of claim 5, wherein said first automatic gain control circuit operates only during detection and acquisition.

7. The receiver of claim 5, herein said second automatic gain control circuit operates only during tracking.

8. The receiver of claim 3 wherein said receiver partitions the data symbols of said waveform into a block of a predetermined number of symbols and wherein said block automatic gain control circuit normalizes said block of received symbols as a function of the root mean square average value of a predetermined attribute of each of the received symbols in said block of received symbols.

9. The receiver of claim 3 wherein said receiver partitions the data symbols of said waveform into a block of a predetermined number of symbols and wherein said block automatic gain control circuit normalizes said block of received symbols as a function of the peak detection value of a predetermined attribute of each of the received symbols in said block of received symbols.

10. The receiver of claim 1 wherein said communication system is a satellite communication system.

11. In a receiver in a communication system for demodulation of a waveform with a sample-by-sample automatic gain control circuit, the improvement comprising a block automatic gain control circuit to detect and acquire a waveform and to pass initial conditions to said sample-by-sample automatic gain control circuit for demodulation of the waveform, wherein said waveform is a short duration preamble waveform, and wherein said block automatic gain control circuit normalizes a block of received symbols as a function of the average value of a predetermined attribute of each of the received symbols in said block of received symbols.

12. In a receiver in a communication system for demodulation of a waveform with a sample-by-sample automatic gain control circuit, the improvement comprising a block automatic gain control circuit to detect and acquire a waveform and to pass initial conditions to said sample-by-sample automatic gain control circuit for demodulation of the waveform, wherein said waveform is a short duration preamble waveform and wherein said block automatic gain control circuit normalizes a block of received symbols as a function of the root mean square average value of a predetermined attribute of each of the received symbols in said block of received symbols.

13. In a receiver in a communication system for demodulation of a waveform with a sample-by-sample automatic gain control circuit, the improvement comprising a block automatic gain control circuit to detect and acquire a waveform and to pass initial conditions to said sample-by-sample automatic gain control circuit for demodulation of the waveform, wherein said waveform is a short duration preamble waveform and wherein said block automatic gain control circuit normalizes a block of received symbols as a function of the peak detection value of a predetermined attribute of each of the received symbols in said block of received symbols.

14. A receiver in a communication system having an automatic gain control circuit for detection of a waveform including data symbols, comprising:
 a block automatic gain control circuit for preamble detection having a gain control which is a function of the energy in a block of data symbols for signal acquisition, and,
 a sample-by-sample automatic gain control circuit for tracking the waveform, wherein said block automatic gain control circuit and said sample-by-sample automatic gain control circuit operate sequentially and non-concurrently.

15. The receiver of claim 14 wherein the waveform is a short duration preamble waveform.

16. The receiver of claim 14 wherein said block automatic gain control circuit is set for preamble detection as a function of the average energy of the data symbols in said block of data symbols.

17. The receiver of claim 14 wherein said block automatic gain control circuit is set for preamble detection as a function of the root mean square average energy of the data symbols in said block of data symbols.

18. The receiver of claim 14 wherein said block automatic gain control circuit is set for preamble detection as a function of the peak energy of the data symbols in said block of data symbols.

19. A method of receiving at an unknown time of arrival a waveform including data symbols, comprising the steps of:
  detecting and acquiring said waveform with a first automatic gain control circuit; and,
  tracking said waveform with a second automatic gain control circuit, wherein said step of detecting and acquiring and said step of tracking are performed sequentially and non-concurrently.

20. The method of claim 19 wherein the waveform is a short duration preamble waveform.

21. The method of claim 20 wherein said first automatic gain control circuit is a block automatic gain control circuit.

22. The method of claim 21 wherein said second automatic gain control circuit is a sample-by-sample automatic gain control circuit.

23. The method of claim 22, wherein the second automatic gain control circuit is inactive during detection and acquisition of the waveform.

24. The method of claim 21, wherein the block automatic gain control circuit shuts down after detection and acquisition of the waveform.

25. The method of claim 20 wherein the waveform is a satellite communication signal.

26. The method of claim 19 wherein the step of detecting and acquiring includes normalizing a block of received symbols as a function of the average value of a predetermined attribute of each of the received symbols in said block of received symbols.

27. The method of claim 19 wherein the step of detecting and acquiring includes normalizing a block of received symbols as a function of the root mean square average value of a predetermined attribute of each of the received symbols in said block of received symbols.

28. The method of claim 19 wherein the step of detecting and acquiring includes normalizing a block of received symbols as a function of the peak detection value of a predetermined attribute of each of the received symbols in said block of received symbols.

29. In a receiver in a communication system for demodulation of a waveform with a sample-by-sample automatic gain control circuit, the improvement comprising a block automatic gain control circuit to detect and acquire a waveform and to pass initial conditions to said sample-by-sample automatic gain control circuit for demodulation of the waveform, wherein said sample by sample automatic gain control circuit operates only during tracking.

* * * * *